(12) United States Patent
Song et al.

(10) Patent No.: US 10,910,370 B2
(45) Date of Patent: Feb. 2, 2021

(54) INTEGRATED CIRCUIT DEVICES INCLUDING A VERTICAL FIELD-EFFECT TRANSISTOR (VFET) AND A FIN FIELD-EFFECT TRANSISTOR (FINFET) AND METHODS OF FORMING THE SAME

(71) Applicant: Samsung Electronics Co., Ltd., Suwon-si (KR)

(72) Inventors: Seung Hyun Song, Suwon-si (KR); Young Chai Jung, Anyang-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/358,245

(22) Filed: Mar. 19, 2019

(65) Prior Publication Data

US 2020/0144254 A1    May 7, 2020

Related U.S. Application Data

(60) Provisional application No. 62/754,884, filed on Nov. 2, 2018.

(51) Int. Cl.
| | |
|---|---|
| *H01L 27/088* | (2006.01) |
| *H01L 29/10* | (2006.01) |
| *H01L 29/08* | (2006.01) |
| *H01L 29/78* | (2006.01) |
| *H01L 21/8234* | (2006.01) |

(52) U.S. Cl.
CPC .. *H01L 27/0886* (2013.01); *H01L 21/823412* (2013.01); *H01L 21/823418* (2013.01); *H01L 21/823431* (2013.01); *H01L 21/823487* (2013.01); *H01L 29/0847* (2013.01); *H01L 29/1037* (2013.01); *H01L 29/7827* (2013.01); *H01L 29/7851* (2013.01)

(58) Field of Classification Search
None
See application file for complete search history.

(56) References Cited

U.S. PATENT DOCUMENTS 5,563,077 A * 10/1996 Ha .................... H01L 29/66795
257/401
7,538,391 B2   5/2009 Chidambarrao et al.
(Continued)

FOREIGN PATENT DOCUMENTS

JP        3196858        6/2001

*Primary Examiner* — Long Pham
(74) *Attorney, Agent, or Firm* — Myers Bigel, P.A.

(57) ABSTRACT

Integrated circuit devices and methods of forming the same are provided. Integrated circuit devices may include a channel region protruding from a substrate in a vertical direction, a first source/drain region, and a second source/drain region. The first source/drain region may vertically overlap the channel region. The first and second source/drain regions may contact a first portion and a second portion of the channel region, respectively, and a third portion of the channel region between the first and second portions may include a first channel region extending longitudinally in a first horizontal direction that is perpendicular to the vertical direction and a second channel region extending longitudinally in a second horizontal direction that is perpendicular to the vertical direction and traverses the first horizontal direction. The integrated circuit devices may also include a gate structure on opposing vertical sides of the channel region.

20 Claims, 25 Drawing Sheets

(56) References Cited

U.S. PATENT DOCUMENTS

| | | |
|---|---|---|
| 8,617,937 B2 | 12/2013 | Cheng et al. |
| 9,041,099 B2 * | 5/2015 | Surthi ............... H01L 29/66795 |
| | | 257/334 |
| 9,202,921 B2 * | 12/2015 | Wu .................... H01L 27/10879 |
| 9,893,191 B2 * | 2/2018 | Wen ..................... H01L 29/7853 |
| 10,090,410 B1 | 10/2018 | Chi et al. |
| 10,170,473 B1 * | 1/2019 | Zang ................... H01L 29/1037 |
| 2016/0056295 A1 * | 2/2016 | Wen ..................... H01L 29/7851 |
| | | 257/369 |
| 2017/0005090 A1 * | 1/2017 | Ando ................. H01L 27/0886 |
| 2017/0092756 A1 * | 3/2017 | Lai .................... H01L 21/28114 |
| 2017/0098709 A1 * | 4/2017 | Dias ..................... H01L 21/845 |
| 2017/0117373 A1 * | 4/2017 | Ando ................... H01L 29/6653 |
| 2017/0200786 A1 | 7/2017 | Zang et al. |
| 2017/0213738 A1 * | 7/2017 | Lai ....................... H01L 21/3065 |
| 2018/0006025 A1 | 1/2018 | Hook et al. |
| 2018/0240907 A1 | 8/2018 | Anderson et al. |
| 2019/0214482 A1 * | 7/2019 | Xie ................... H01L 21/02532 |

\* cited by examiner

FIG. 2A
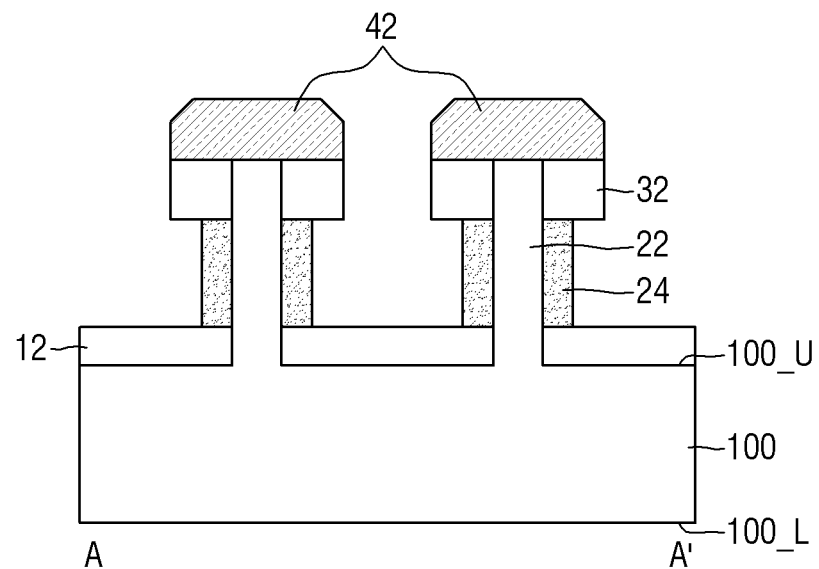
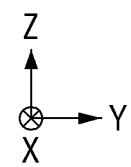
FIG. 2B
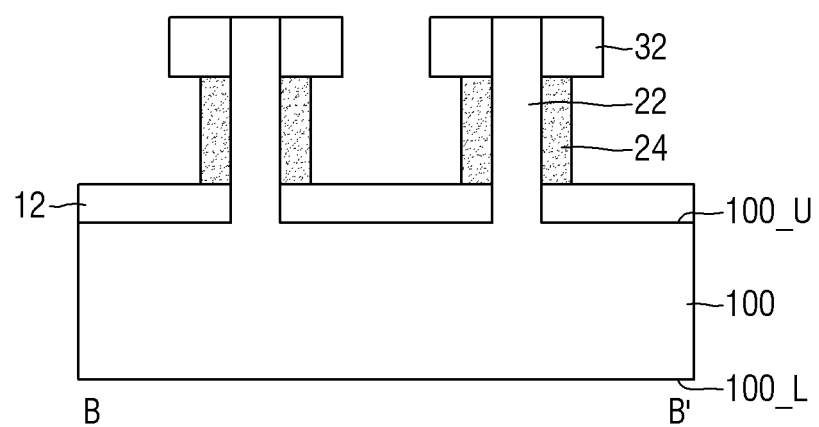
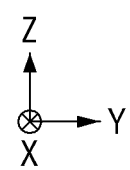

FIG. 4A
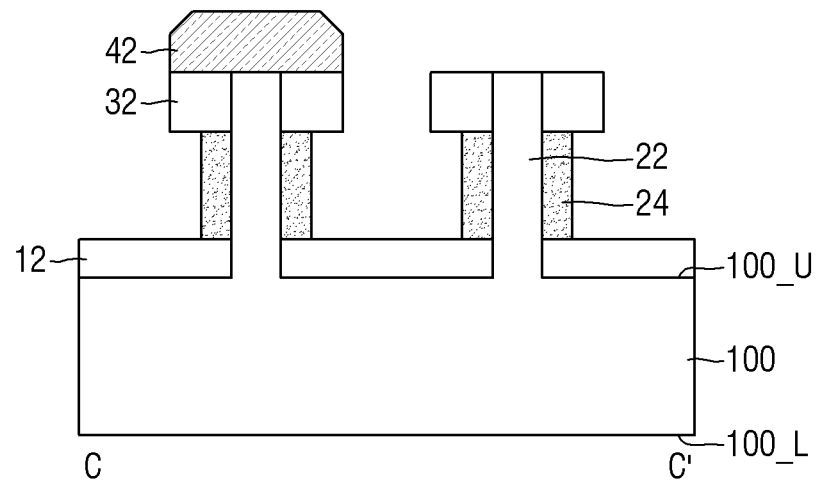
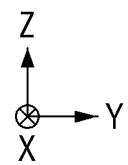
FIG. 4B
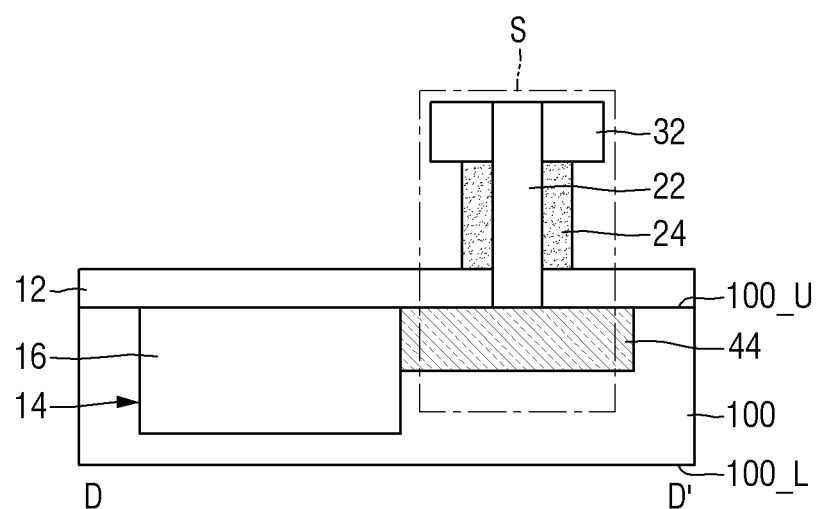
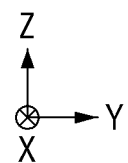

FIG. 6A
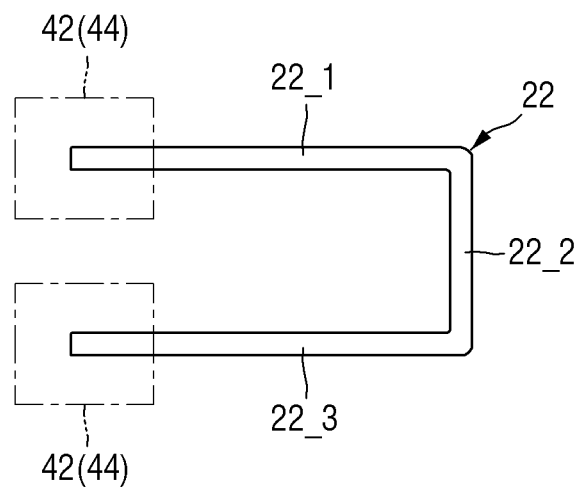
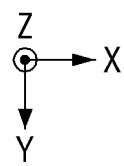
FIG. 6B
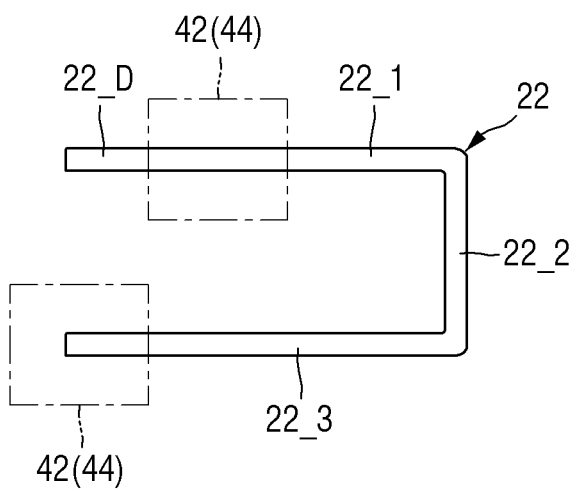
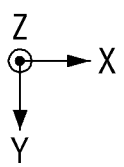

FIG. 6C
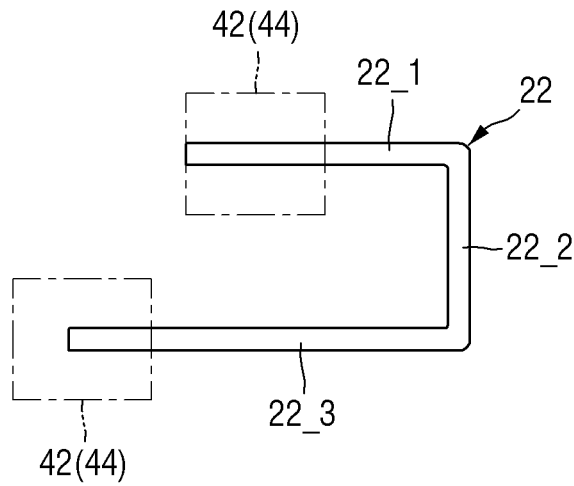
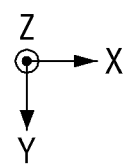
FIG. 6D
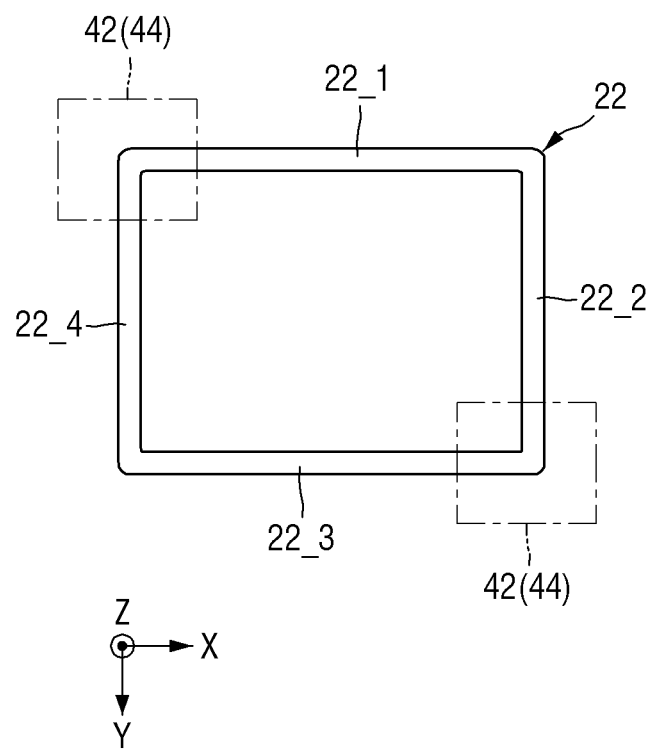
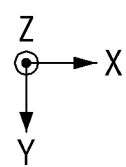

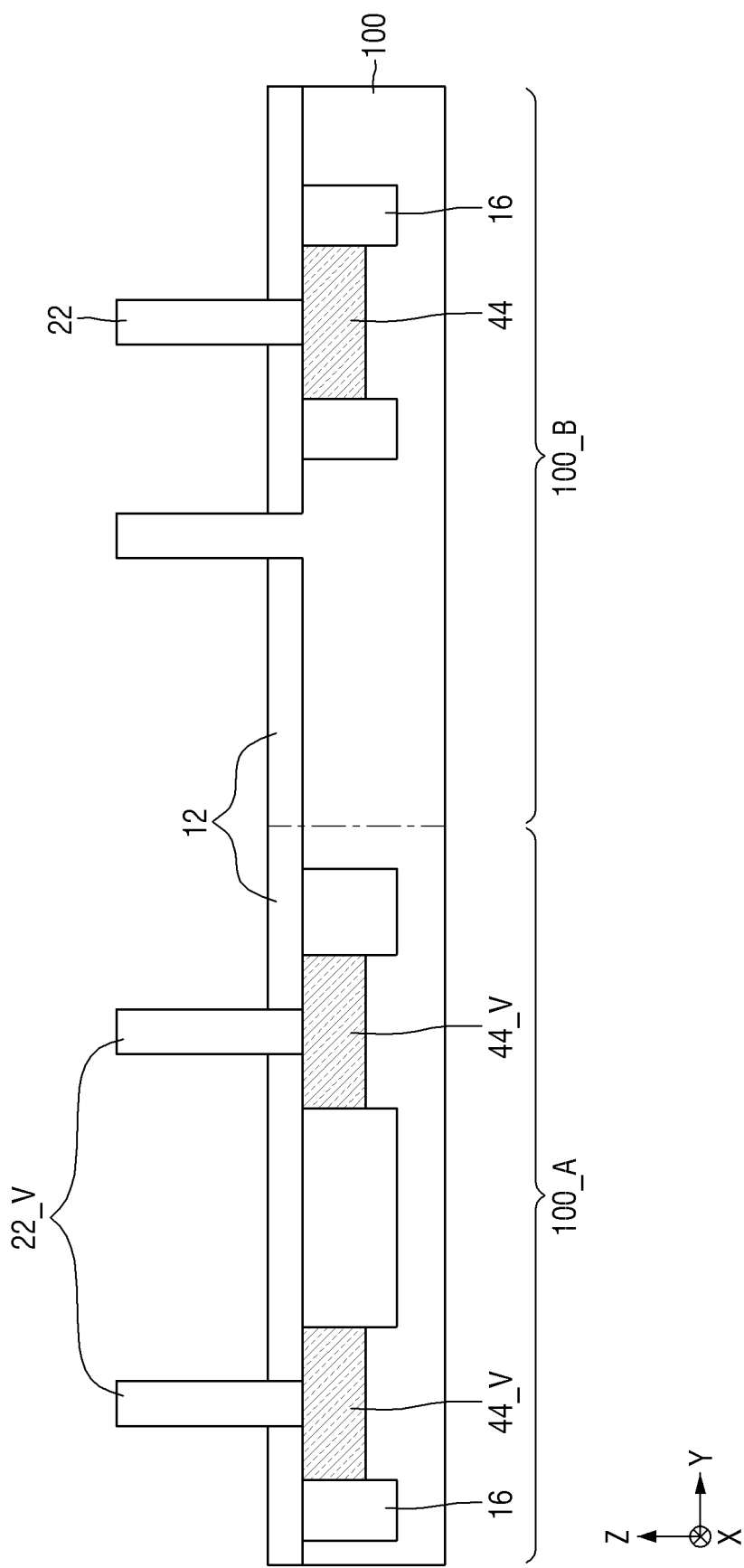

INTEGRATED CIRCUIT DEVICES INCLUDING A VERTICAL FIELD-EFFECT TRANSISTOR (VFET) AND A FIN FIELD-EFFECT TRANSISTOR (FINFET) AND METHODS OF FORMING THE SAME

CROSS-REFERENCE TO RELATED APPLICATION

This application claims priority to U.S. Provisional Application Ser. No. 62/754,884, entitled FINFET/VFET STRUCTURE FOR HIGH DENSITY INTEGRATION, filed in the USPTO on Nov. 2, 2018, the disclosure of which is hereby incorporated by reference herein in its entirety.

FIELD

The present disclosure generally relates to the field of electronics and, more particularly, to vertical field-effect transistor (VFET) devices.

BACKGROUND

Various structures and manufacturing processes of VFET devices have been researched because of their high scalability. It, however, may be difficult to form VFETs having different channel lengths.

SUMMARY

According to some embodiments of the present inventive concept, integrated circuit devices may include a channel region protruding from a substrate in a vertical direction that is perpendicular to an upper surface of the substrate, a first source/drain region, and a second source/drain region. The first source/drain region may vertically overlap the channel region. The first and second source/drain regions may contact a first portion and a second portion of the channel region, respectively, and a third portion of the channel region between the first and second portions may include a first channel region extending longitudinally in a first horizontal direction that is perpendicular to the vertical direction and a second channel region extending longitudinally in a second horizontal direction that is perpendicular to the vertical direction and traverses the first horizontal direction. The integrated circuit devices may also include a gate structure on opposing vertical sides of the channel region.

According to some embodiments of the present inventive concept, integrated circuit devices may include a Fin field-effect transistor (FinFET). The FinFET may include a channel region protruding from a substrate in a vertical direction that is perpendicular to an upper surface of the substrate, a first source/drain region, and a second source/drain region. The first source/drain region may vertically overlap the channel region. The FinFET may also include a gate structure on opposing vertical sides of the channel region, and the gate structure may be curved in plan view.

According to some embodiments of the present inventive concept, integrated circuit devices may include a channel region protruding from a substrate in a vertical direction that is perpendicular to an upper surface of the substrate. The channel region may include first and second channel regions that are spaced apart from each other in a first horizontal direction and extend longitudinally in a second horizontal direction that is perpendicular to the vertical direction and traverses the first horizontal direction. The integrated circuit devices may also include a first source/drain region and a second source/drain region. The first source/drain region may vertically overlap the channel region. The integrated circuit devices may further include a gate structure extending on opposing vertical sides of the channel region and an insulating layer. The first source/drain region and the gate structure may be spaced apart from each other in the vertical direction by a gap between the first source/drain region and the gate structure, and the insulating layer may be in the gap.

BRIEF DESCRIPTION OF THE DRAWINGS

FIGS. 2A and 2B are cross-sectional views taken along the lines A-A' and B-B' of FIG. 1A, respectively, according to some embodiments of the present inventive concept.

FIGS. 4A and 4B are cross-sectional views taken along the lines C-C' and D-D' of FIG. 3A, respectively, according to some embodiments of the present inventive concept.

FIGS. 6A, 6B, 6C, and 6D show configurations of a channel region and source/drain regions according to some embodiments of the present inventive concept.

FIGS. 18, 19, and 20 are cross-sectional views illustrating methods of forming an integrated circuit device including a VFET and a FinFET according to some embodiments of the inventive concept.

DETAILED DESCRIPTION

According to some embodiments of the present inventive concept, a single integrated circuit device (e.g., an integrated circuit chip) may include both a VFET and a non-VFET (e.g., a planar transistor, a Fin field-effect transistor (FinFET)) such that transistors having different channel lengths can be provided.

Figure 1A:
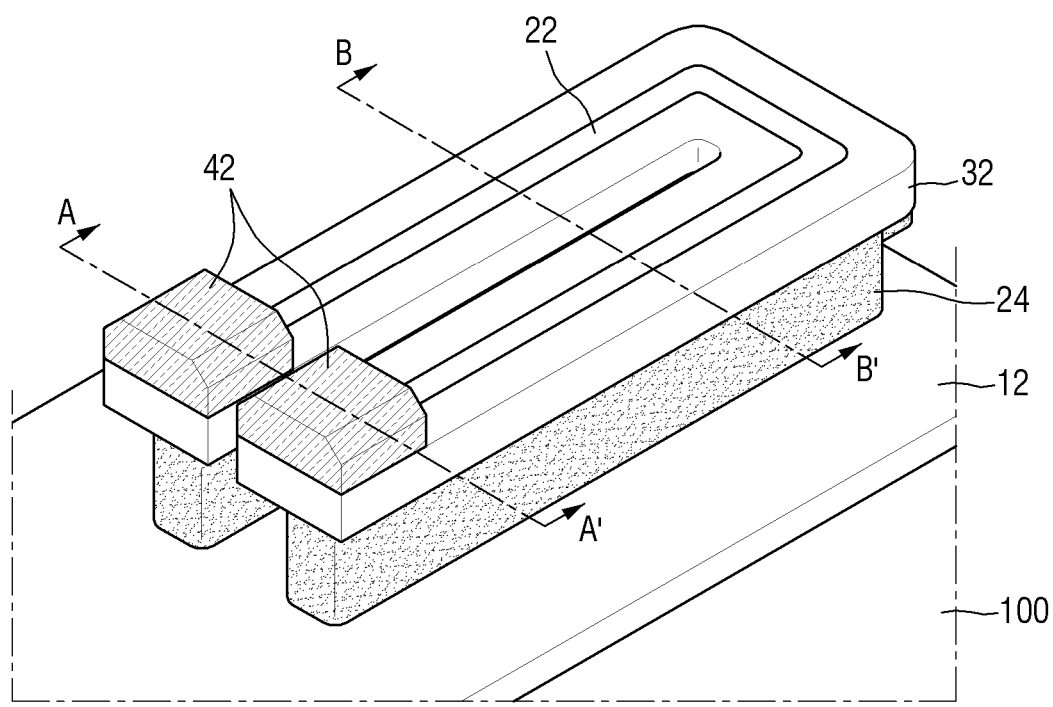
FIG. 1A is a perspective view of a FinFET device according to some embodiments of the present inventive concept.
Figure 1B:
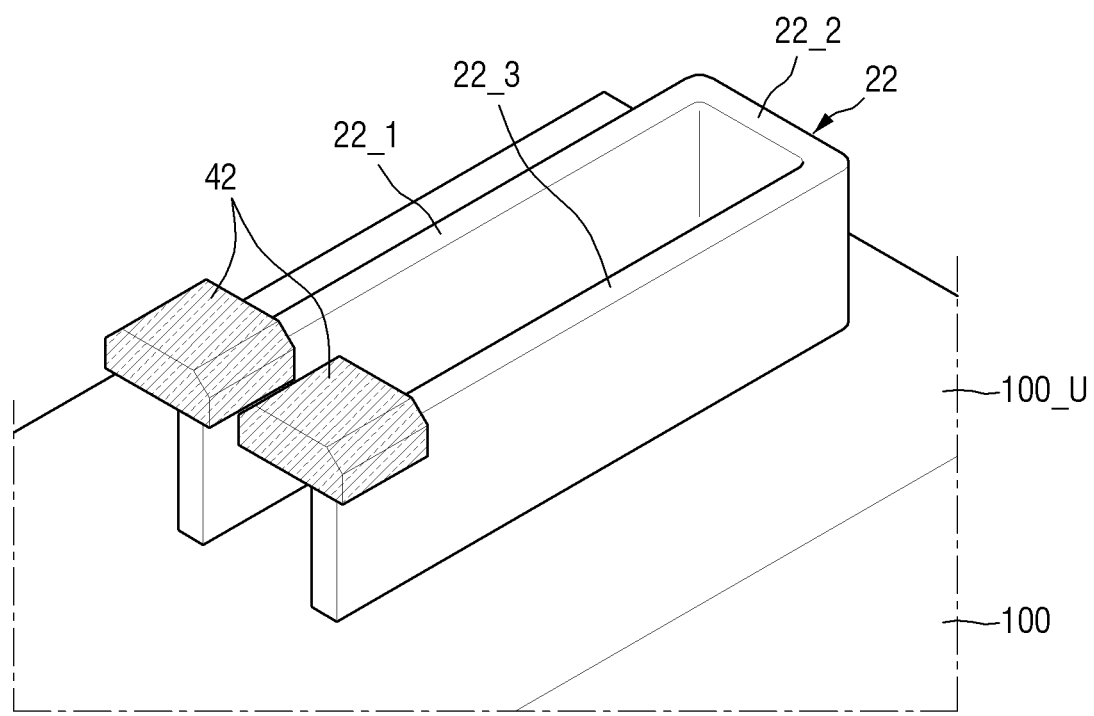
FIGS. 1B and 1C are perspective views of portions of the FinFET device of FIG. 1A according to some embodiments of the present inventive concept.
Figure 1C:
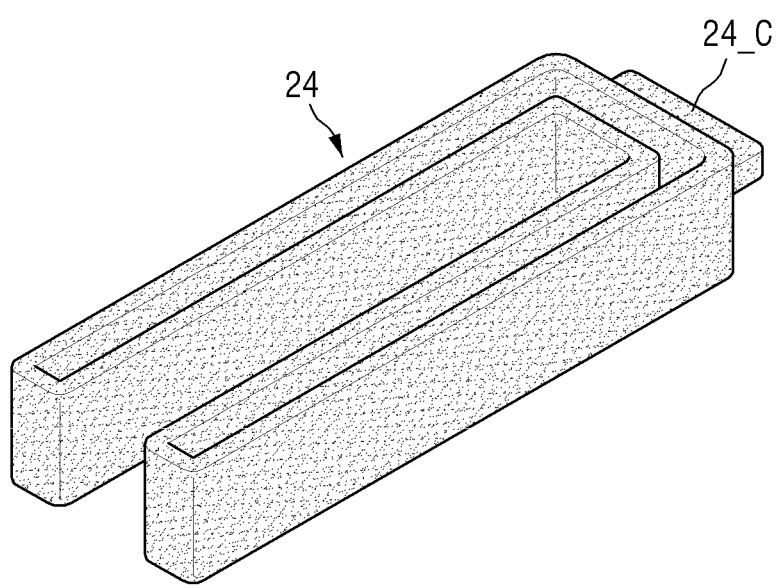

FIG. 1A is a perspective view of a FinFET device according to some embodiments of the present inventive concept. FIGS. 1B and 1C are perspective views of portions of the FinFET device of FIG. 1A according to some embodiments of the present inventive concept. FIGS. 2A and 2B are cross-sectional views taken along the lines A-A' and B-B' of FIG. 1A, respectively, according to some embodiments of the present inventive concept.

Referring to FIGS. 1A through 2B, the FinFET device may include a channel region 22 on a substrate 100. The substrate 100 may include opposing surfaces, an upper surface 100_U and a lower surface 100_L. The upper surface 100_U and the lower surface 100_L of the substrate 100 may be parallel to each other. The substrate 100 may include one or more semiconductor materials, for example, Si, Ge, SiGe, GaP, GaAs, SiC, SiGeC and/or InP. In some embodiments, the substrate 100 may be a bulk substrate (e.g., a bulk silicon substrate) or a semiconductor on insulator (SOI) substrate. The channel region 22 may include materials the same as the substrate 100 or may include materials different from the substrate 100.

The channel region 22 may protrude from the substrate 100 in a vertical direction Z that may be perpendicular to the upper surface 100_U of the substrate 100. A lower insulating layer 12 may extend on the substrate 100 and on opposing vertical sides of the channel region 22. In some embodiments, the lower insulating layer 12 may be only on lower portions of the opposing vertical sides of the channel region 22, as illustrated in FIGS. 2A and 2B. The lower insulating layer 12 may include insulating material(s). For example, the lower insulating layer 12 may include silicon oxide, silicon nitride, and/or silicon oxynitride.

A gate structure 24 may be on the opposing vertical sides of the channel region 22. Referring to FIGS. 1A and 1C, it will be understood that, in some embodiments, the gate structure 24 may enclose the channel region 22 in plan view. The gate structure 24 may include a contact portion 24_C through which a gate voltage is applied to the gate structure 24. In some embodiments, the gate structure 24 may be curved (e.g., bent) twice in plan view. It will be understood that "an element A being curved" (or similar language) means that the element A include two portions that are connected to each other and extend in different directions (e.g., directions perpendicular to each other). In some embodiments, an upper portion of the channel region 22 may protrude in the vertical direction Z beyond an upper surface of the gate structure 24, and thus the gate structure 24 may expose upper portions of the opposing vertical sides of the channel region 22 and an upper surface of the channel region 22. The gate structure 24 may be spaced apart from the substrate 100 in the vertical direction Z by a gap, and the lower insulating layer 12 may be in the gap and may extend between the gate structure 24 and the substrate 100. The lower insulating layer 12 may separate the gate structure 24 from the substrate 100 and thus may electrically isolate the gate structure 24 from the substrate 100.

An upper insulating layer 32 may be on the gate structure 24 and the opposing vertical sides of the channel region 22. In some embodiments, the upper insulating layer 32 may be only on upper portions of the opposing vertical sides of the channel region 22, as illustrated in FIGS. 2A and 2B. The upper insulating layer 32 may include insulating material(s). For example, the upper insulating layer 32 may include silicon oxide, silicon nitride, and/or silicon oxynitride. In some embodiments, the upper insulating layer 32 may include material(s) the same as the lower insulating layer 12.

First and second source/drain regions 42 may be on the channel region 22. In some embodiments, each of the first and second source/drain regions 42 may be on and may contact the upper surface of the channel region 22, as illustrated in FIG. 2A, and may be referred to as a top source/drain region. Each of the first and second source/drain regions 42 may vertically overlap the channel region 22. In some embodiments, the first and second source/drain regions 42 may be on end portions of the channel region 22, respectively, as illustrated in FIG. 1B. The first and second source/drain regions 42 may include a semiconductor material and/or dopant atoms (e.g., boron atoms, phosphorous atoms, arsenic atoms). In some embodiments, the gate structure 24 may expose an entirety of a portion of the upper surface of the channel region 22, which is not vertically overlapped by the first and second source/drain regions 42.

Referring to FIGS. 1A, 1B, and 2A, the first and second source/drain regions 42 may contact a first portion and a second portion of the channel region 22, respectively, and a third portion of the channel region 22 between the first and second portions may include a first channel region 22_1 extending longitudinally in a first horizontal direction X that may be perpendicular to the vertical direction Z, a second channel region 22_2 extending longitudinally in a second horizontal direction Y that may be perpendicular to the vertical direction Z and may traverse the first horizontal direction X, and a third channel region 22_3 extending longitudinally in the first horizontal direction X. In some embodiments, the first channel region 22_1 and the third channel region 22_3 may have an equal length in the first horizontal direction X.

In some embodiments, the gate structure 24 may extend from the first portion of the channel region 22 onto the second portion of the channel region 22. The first and second source/drain regions 42 may be spaced apart from the gate structure 24 in the vertical direction Z by a gap, and the upper insulating layer 32 may be in the gap and may be between the first and second source/drain regions 42 and the gate structure 24. The upper insulating layer 32 may separate the first and second source/drain regions 42 from the gate structure 24 and thus may electrically isolate the first and second source/drain regions 42 from the gate structure 24.

Figure 3A:
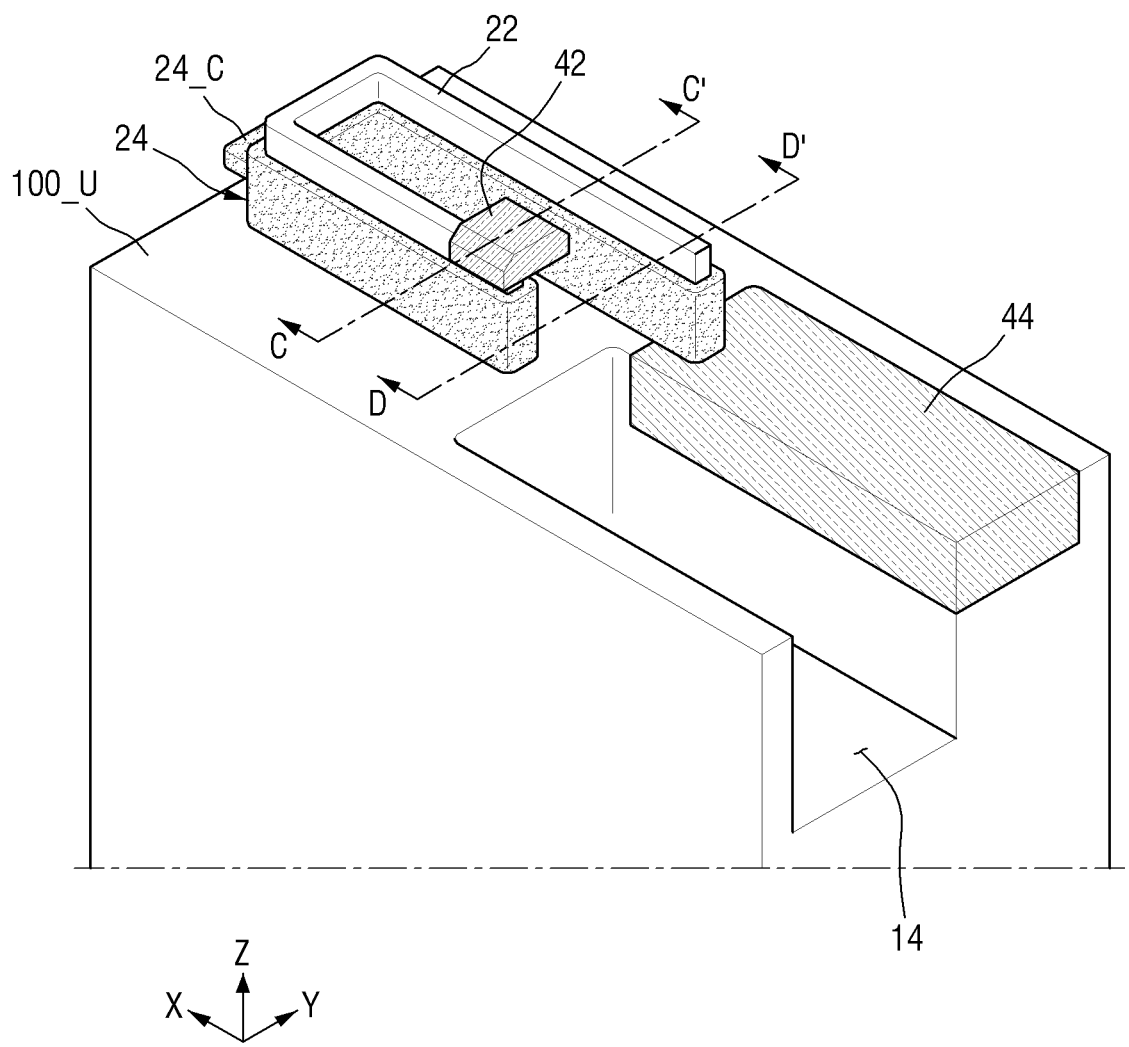
FIG. 3A is a perspective view of a FinFET device according to some embodiments of the present inventive concept.
Figure 3B:
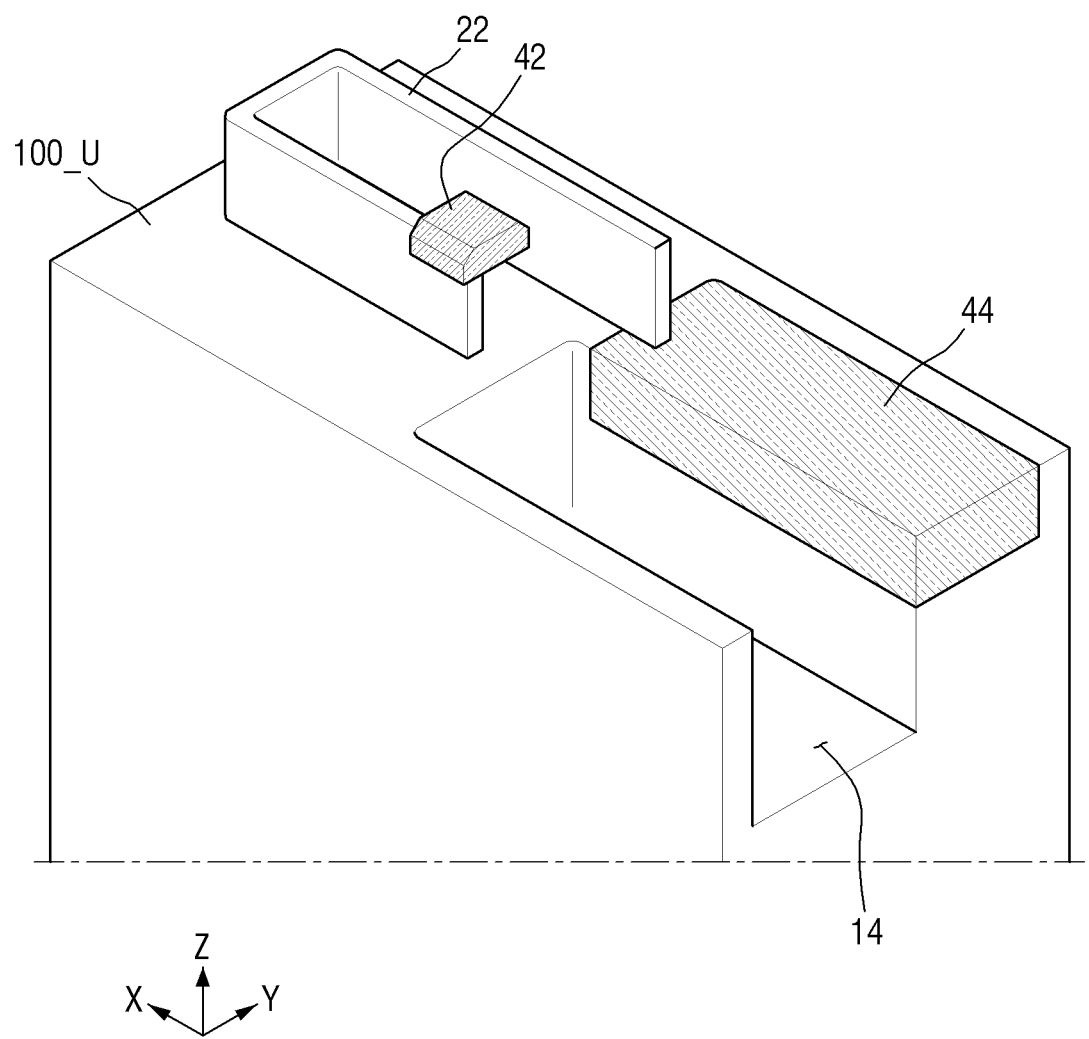
FIGS. 3B and 3C are perspective views of portions of the FinFET device of FIG. 3A according to some embodiments of the present inventive concept.
Figure 3C:
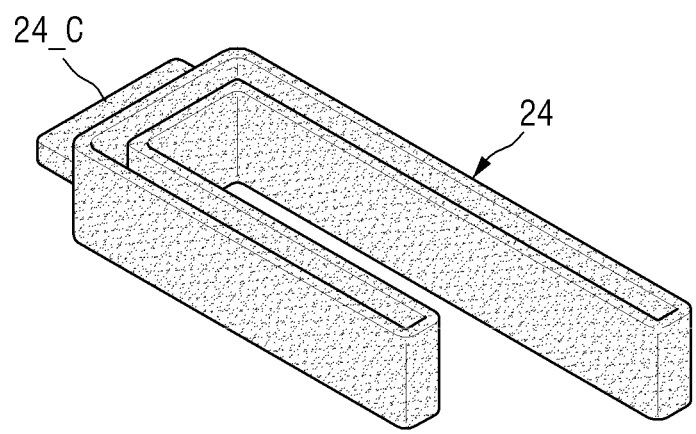

FIG. 3A is a perspective view of a FinFET device according to some embodiments of the present inventive concept. FIGS. 3B and 3C are perspective views of portions of the FinFET device of FIG. 3A according to some embodiments of the present inventive concept. FIGS. 4A and 4B are cross-sectional views taken along the lines C-C' and D-D' of FIG. 3A, respectively, according to some embodiments of the present inventive concept.

Referring to FIGS. 3A through 4B, the FinFET device may include a first source/drain region 42 on a channel region 22 and a second source/drain region 44 in a substrate 100. As the second source/drain region 44 is under the channel region 22, the second source/drain region 44 may be referred to as a bottom source/drain region. The channel region 22 may vertically overlap and may contact the second source/drain region 44. The second source/drain region 44 may include a semiconductor material and/or dopant atoms (e.g., boron atoms, phosphorous atoms, arsenic atoms). The substrate 100 may include a trench 14 adjacent the second source/drain region 44 to electrically isolate the second source/drain region 44 from other elements. In some embodiments, a trench insulating layer 16 may be provided in the trench 14. The trench insulating layer 16 may include insulating material(s). For example, the trench insulating layer 16 may include silicon oxide, silicon nitride, and/or silicon oxynitride.

In some embodiments, parallel portions of the channel region 22 extending longitudinally in the first horizontal direction X may have different lengths in the first horizontal direction X to make a distance between the first source/drain region 42 and the second source/drain region 44 in the first horizontal direction X long enough for electrical isolation between the first source/drain region 42 and the second source/drain region 44. However, it will be understood that, in some embodiments, the parallel portions of the channel region 22 extending longitudinally in the first horizontal direction X may have an equal length in the first horizontal direction X.

Figure 5A:
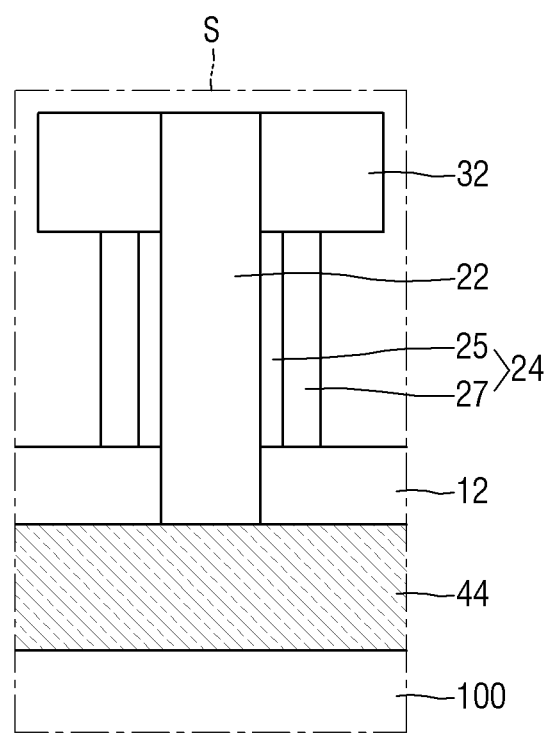
FIGS. 5A and 5B are enlarged views of the region S of FIG. 4B according to some embodiments of the present inventive concept.
Figure 5B:
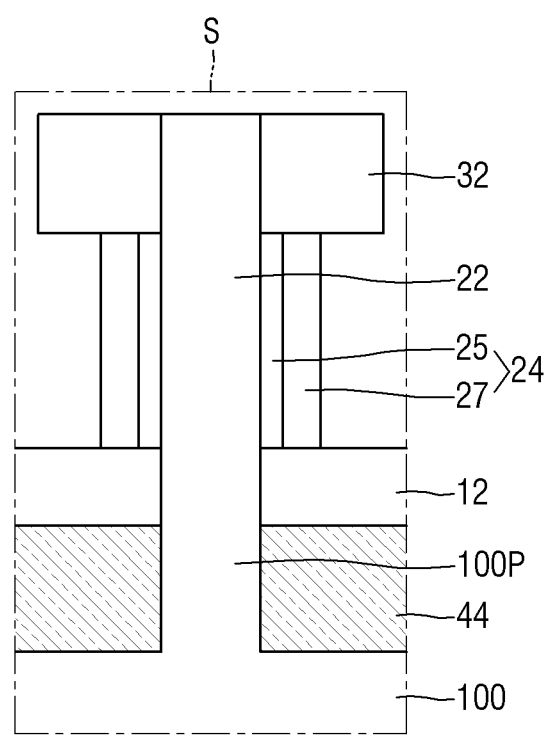

FIGS. 5A and 5B are enlarged views of the region S of FIG. 4B according to some embodiments of the present inventive concept. Referring to FIGS. 5A and 5B, the gate structure 24 may include a gate insulator 25 and a gate electrode 27. The gate insulator 25 may be between the channel region 22 and the gate electrode 27 to electrically isolate the channel region 22 from the gate electrode 27. Each of the gate insulator 25 and the gate electrode 27 may include multiple layers therein. The gate insulator 25 may include, for example, a silicon oxide layer, a silicon oxynitride layer, and/or a high k material layer that has a dielectric constant greater than silicon dioxide. The gate electrode 27 may include a work function controlling layer (e.g., a titanium nitride layer, a tantalum nitride layer), a diffusion barrier layer, and/or a conductive layer (e.g., a semiconductor layer, a metal layer).

In some embodiments, the channel region 22 may vertically overlap the second source/drain region 44, as illustrated in FIG. 5A. In some embodiments, the channel region 22 may be connected to the substrate 100 through a protruding portion 100P of the substrate 100, and the second source/drain region 44 may be on a side of the protruding portion 100P of the substrate 100.

FIGS. 6A, 6B, 6C, and 6D show configurations of a channel region and source/drain regions according to some embodiments of the present inventive concept. Referring to FIG. 6A, a channel region 22 may include a first channel region 22_1 extending longitudinally in the first horizontal direction X, a second channel region 22_2 extending longitudinally in the second horizontal direction Y, and a third channel region 22_3 extending longitudinally in the first horizontal direction X. The first channel region 22_1 and the third channel region 22_3 may have an equal length in the first horizontal direction X, as shown in FIG. 6A. Source/drain regions 42 or 44 may be on end portions of the channel region 22, respectively. Each of the source/drain regions 42 or 44 may be a top source/drain region (e.g., 42 in FIG. 2A) that is on the channel region 22 or a bottom source/drain region (e.g., 44 in FIG. 4B) that is under the channel region 22 and is in the substrate 100.

Referring to FIG. 6B, in some embodiments, one of the source/drain regions 42 or 44 may be on a portion of the channel region 22 that is between end portions of the channel region 22, and thus the channel region 22 may include a dummy channel region 22_D. The first channel region 22_1 may have a length in the first horizontal direction X shorter than that of the third channel region 22_3.

Referring to FIG. 6C, in some embodiments, portions of the channel region 22 extending longitudinally in the first horizontal direction X may have different lengths in the first horizontal direction X, and source/drain regions 42 or 44 may be on end portions of the channel region 22, respectively. The first channel region 22_1 may have a length in the first horizontal direction X shorter than that of the third channel region 22_3.

Referring to FIG. 6D, in some embodiments, the channel region 22 may have a rectangle shape, and source/drain regions 42 or 44 may be on diagonally facing corners of the channel region 22, respectively. The channel region 22 may include the first channel region 22_1 and the third channel region 22_3, which extend longitudinally in the first horizontal direction X and may also include the second channel region 22_2 and a fourth channel region 22_4 extending longitudinally in the second horizontal direction Y.

Figure 7:
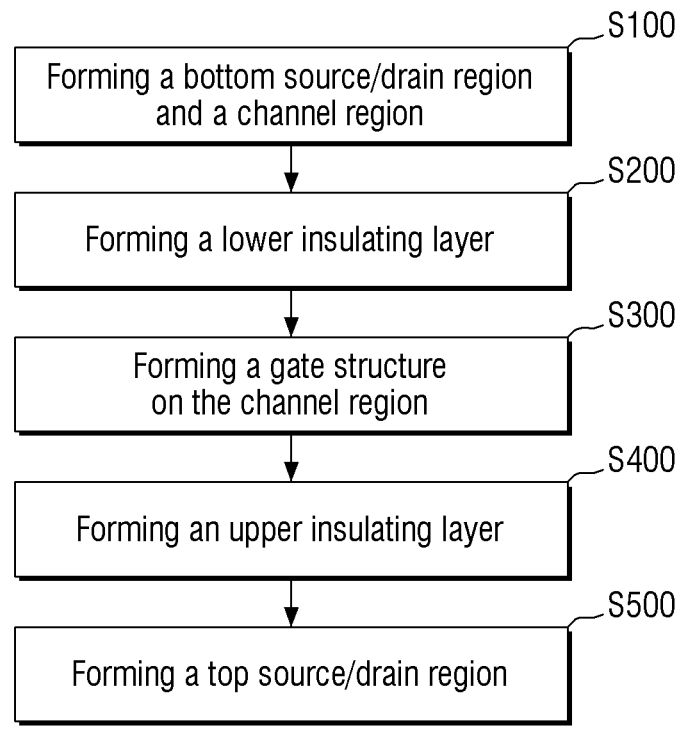
FIG. 7 is a flow chart of methods of forming a FinFET device according to some embodiments of the inventive concept.
Figure 8:
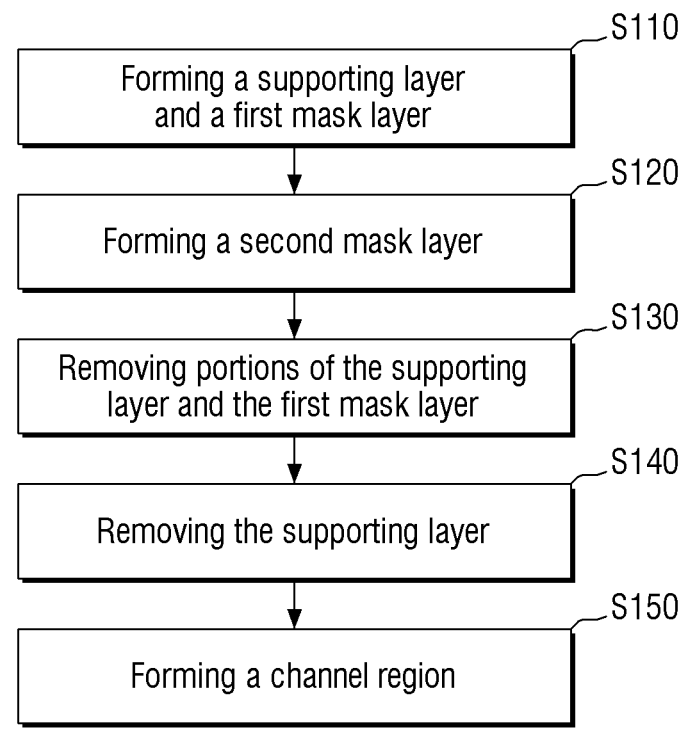
FIG. 8 is a flow chart of methods of forming a channel region of a FinFET device according to some embodiments of the inventive concept.

FIG. 7 is a flow chart of methods of forming a FinFET device according to some embodiments of the inventive concept, and FIG. 8 is a flow chart of methods of forming a channel region of a FinFET device according to some embodiments of the inventive concept. FIGS. 9A, 10A, 11A, 12A, 13A, and 14A are plan views illustrating the methods according to the flow chart of FIG. 8, and FIGS. 9B, 10B, 11B, 12B, 13B, and 14B are cross-sectional views taken along the line E-E' in FIGS. 9A, 10A, 11A, 12A, 13A, and 14A respectively.

Referring to FIG. 7, the methods may include forming a bottom source/drain region (e.g., 44 in FIG. 4B) in a substrate and forming a channel region (e.g., 22 in FIG. 4B) (Block S100). As shown in FIG. 1A, in some embodiments, the FinFET device may not include a bottom source/drain region, and thus forming the bottom source/drain region may be omitted.

Figure 9A:
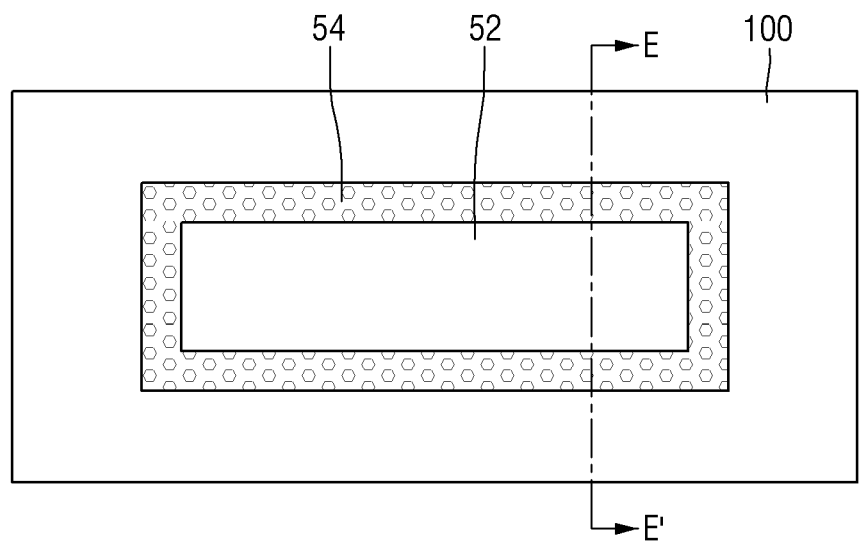
FIGS. 9A, 10A, 11A, 12A, 13A, and 14A are plan views illustrating the methods according to the flow chart of FIG. 8, and FIGS. 9B, 10B, 11B, 12B, 13B, and 14B are cross-sectional views taken along the line E-E' in FIGS. 9A, 10A, 11A, 12A, 13A, and 14A respectively.
Figure 9B:
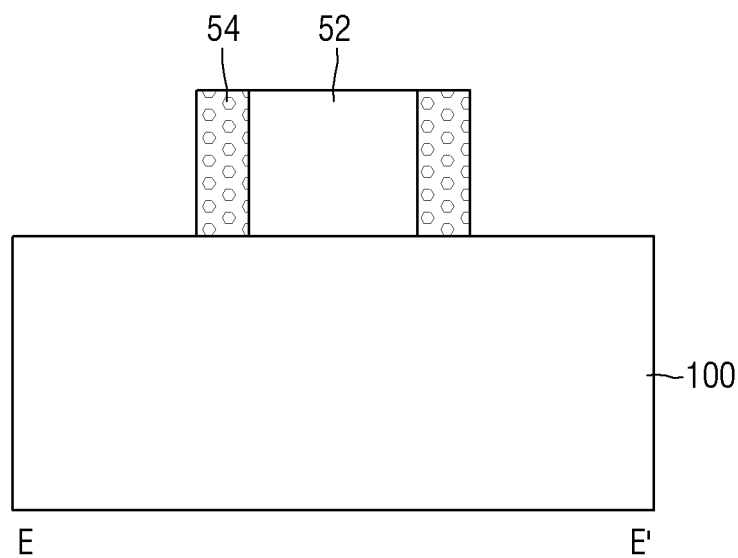

Referring to FIGS. 8, 9A, and 9B, the methods of forming a channel region may include forming a supporting layer 52 on a substrate 100, and forming a first mask layer 54 on a side of the supporting layer 52 (Block S110). In some embodiments, the first mask layer 54 may have an uniform and constant thickness along the side of the supporting layer 52 in plan view as illustrated in FIG. 9A. For example, a preliminary first mask layer (not shown) may be formed conformally on the substrate 100 and the supporting layer 52, and an etching process (e.g., a blanket etching process) may be performed without an etch mask covering the supporting layer 52 and the first mask layer 54. The supporting layer 52 may include material(s) having an etch selectivity with respect to the first mask layer 54. For example, the supporting layer 52 may include silicon oxide, and the first mask layer 54 may include silicon nitride.

Figure 10A:
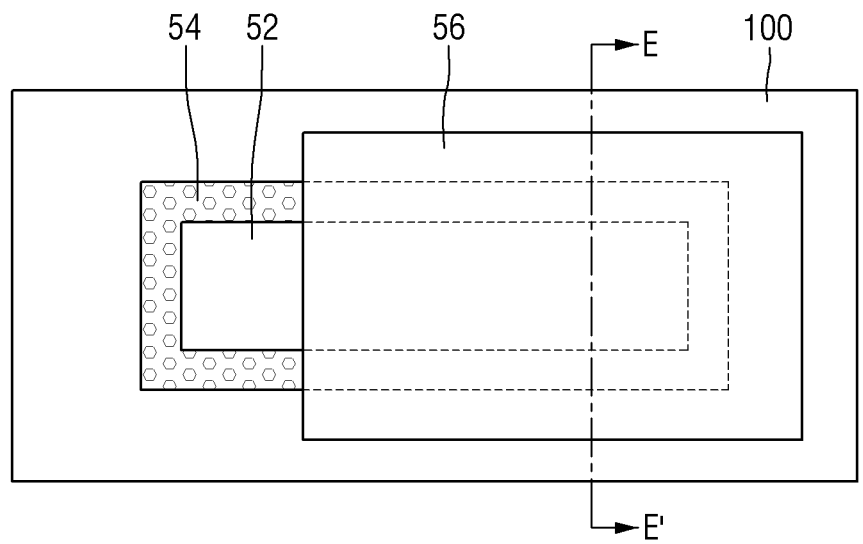
Figure 10B:
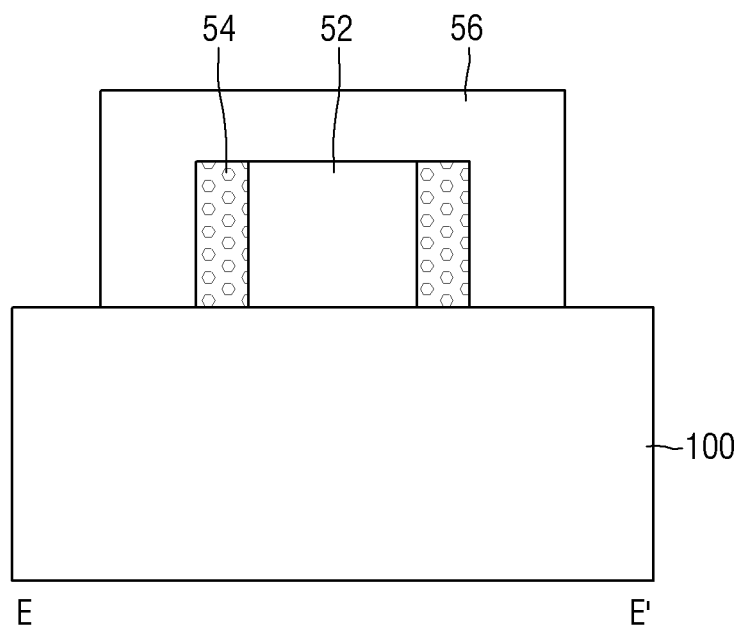

Referring to FIGS. 8, 10A, and 10B, the methods of forming a channel region may include forming a second mask layer 56 on the supporting layer 52 and the first mask layer 54 (Block S120). The second mask layer 56 may expose portions of the supporting layer 52 and the first mask layer 54, as illustrated in FIG. 10A. The second mask layer 56 may include material(s) having an etch selectivity with respect to the supporting layer 52 and the first mask layer 54. For example, the second mask layer 56 may include a photoresist (PR) layer.

Figure 11A:
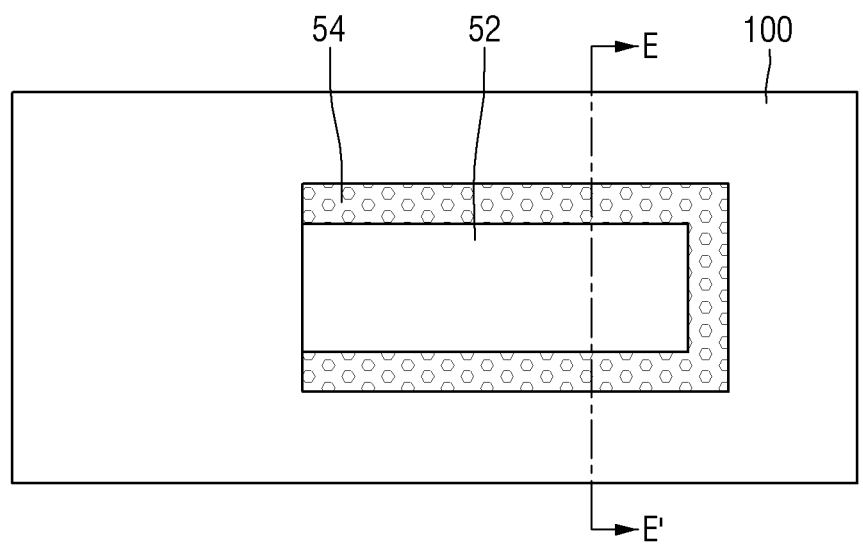
Figure 11B:
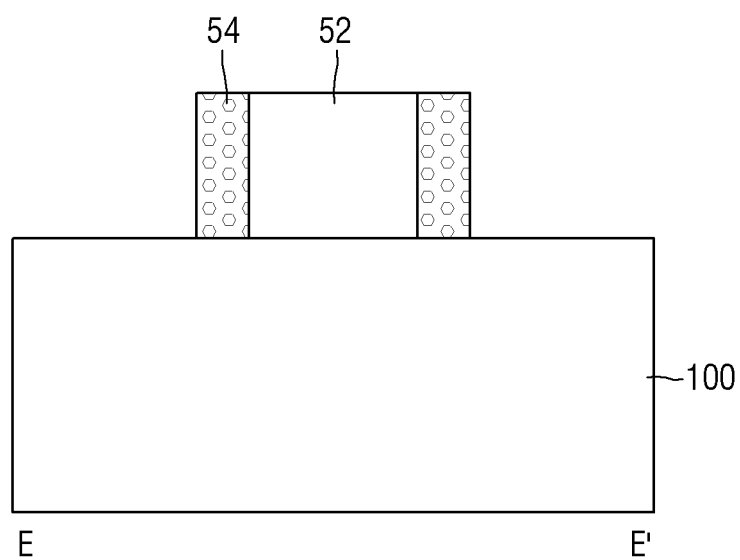

Referring to FIGS. 8, 11A, and 11B, the methods of forming a channel region may include removing the portions of the supporting layer 52 and the first mask layer 54 exposed by the second mask layer 56 (Block S130). In some embodiments, a dry etch process and/or a wet etch process may be performed to remove the portions of the supporting layer 52 and the first mask layer 54 using the second mask layer 56 as an etch mask. In some embodiments, the second mask layer 56 may then be removed.

Figure 12A:
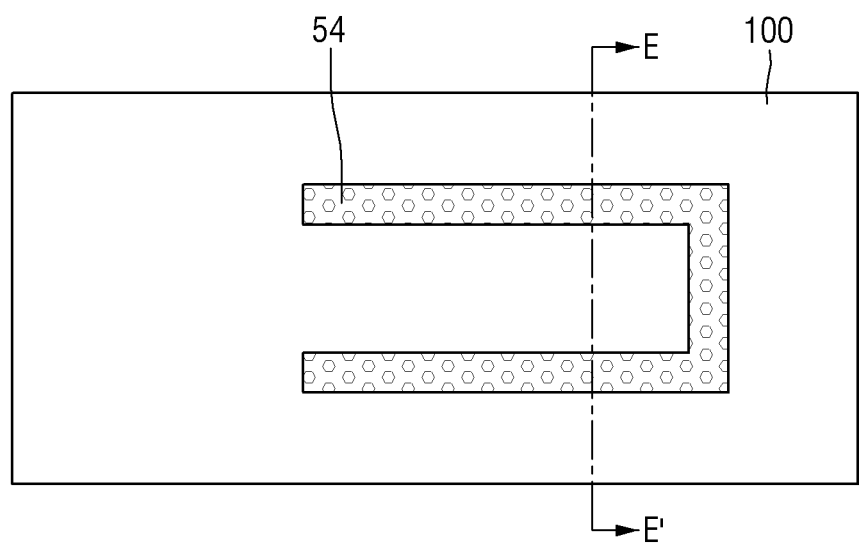
Figure 12B:
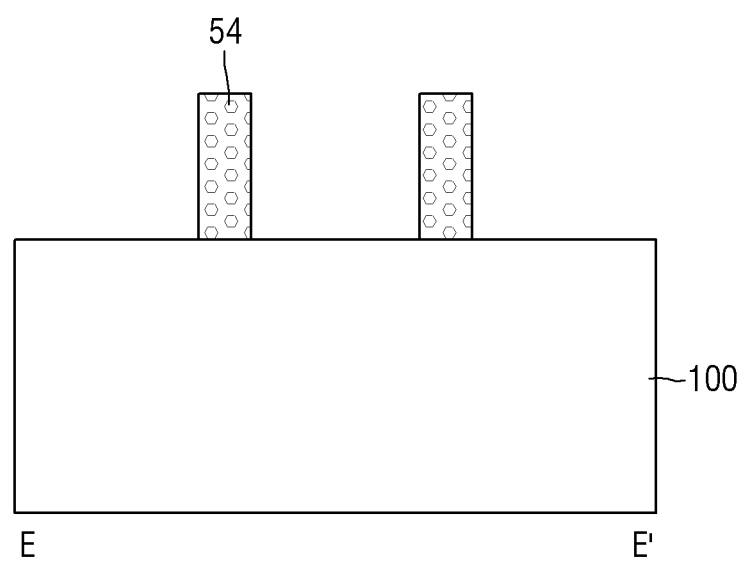
Figure 13A:
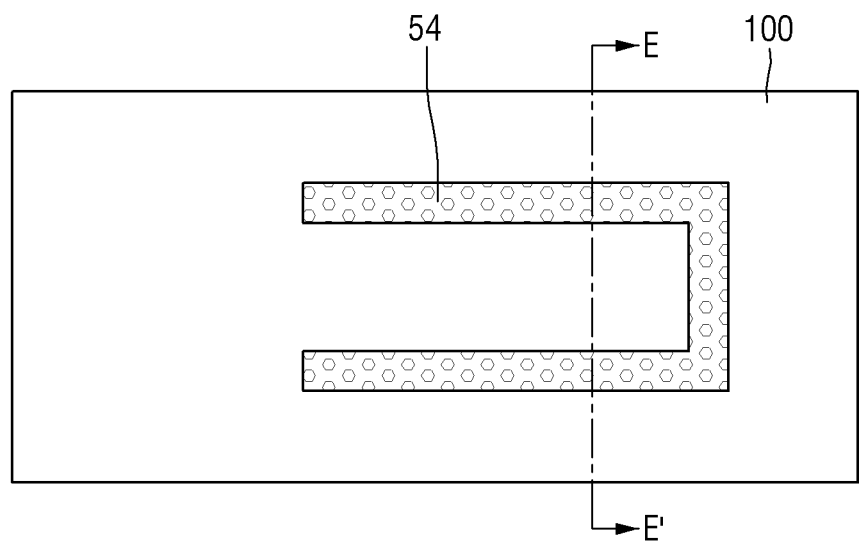
Figure 13B:
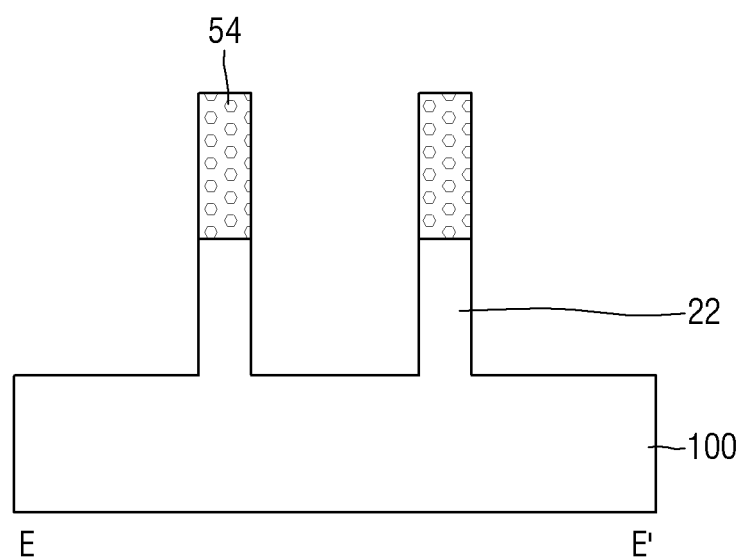

Referring to FIGS. 8, 12A, and 12B, the methods of forming a channel region may include removing the supporting layer 52 (Block S140). In some embodiments, a dry etch process and/or a wet etch process may be performed to remove the supporting layer 52.

Figure 14A:
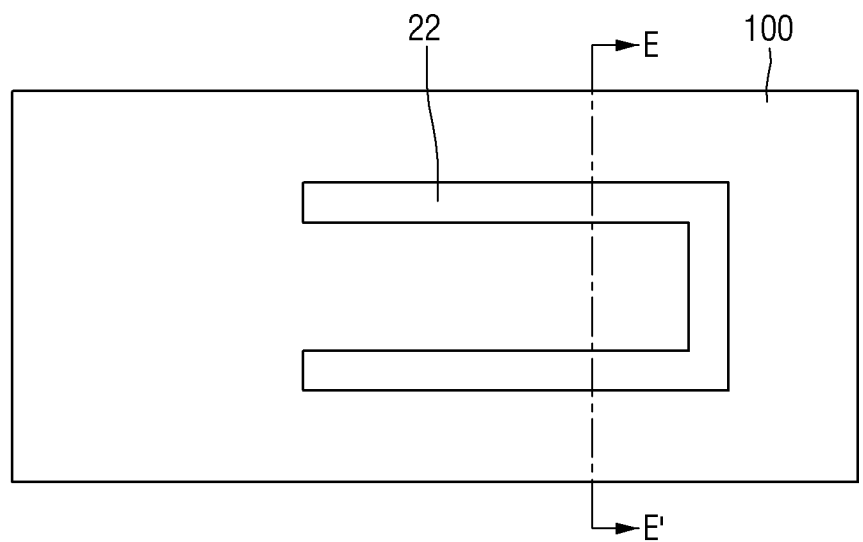
Figure 14B:
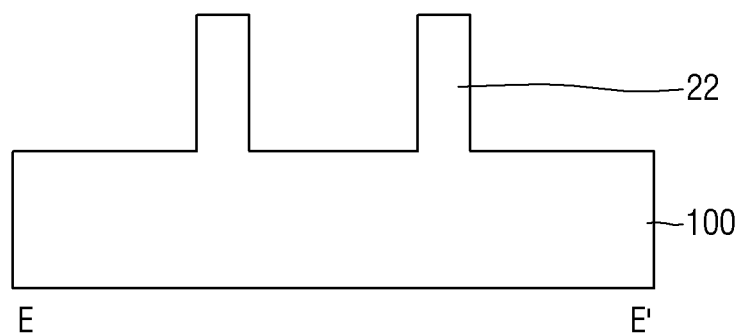

Referring to FIGS. 8, 13A, 13B, 14A, and 14B, the methods of forming a channel region may include forming a channel region 22 by etching the substrate 100 using the first mask layer 54 as an etch mask (Block S150). In some embodiments, a dry etch process and/or a wet etch process may be performed to etch the substrate 100. After forming the channel region 22, the first mask layer 54 may be removed, and an upper surface of the channel region 22 may be exposed as illustrated in FIGS. 14A and 14B.

It will be understood that the channel region 22 shown in FIG. 6C can be formed by modifying a shape of the second mask layer 56. It will be also understood that the channel region 22 shown in FIG. 6D can be formed by omitting the processes of Block S120 and Block S130.

Figure 15:
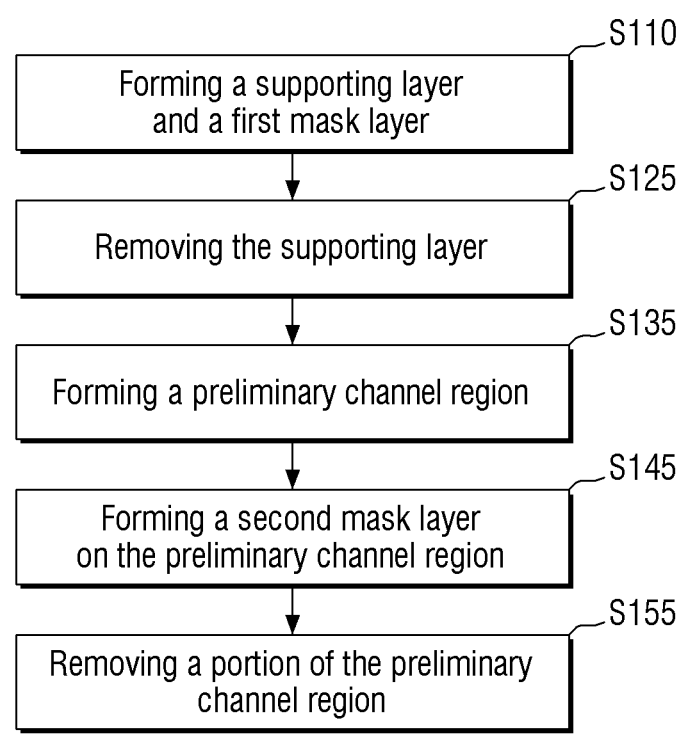
FIG. 15 is a flow chart of methods of forming a channel region of a FinFET device according to some embodiments of the inventive concept.
Figure 16A:
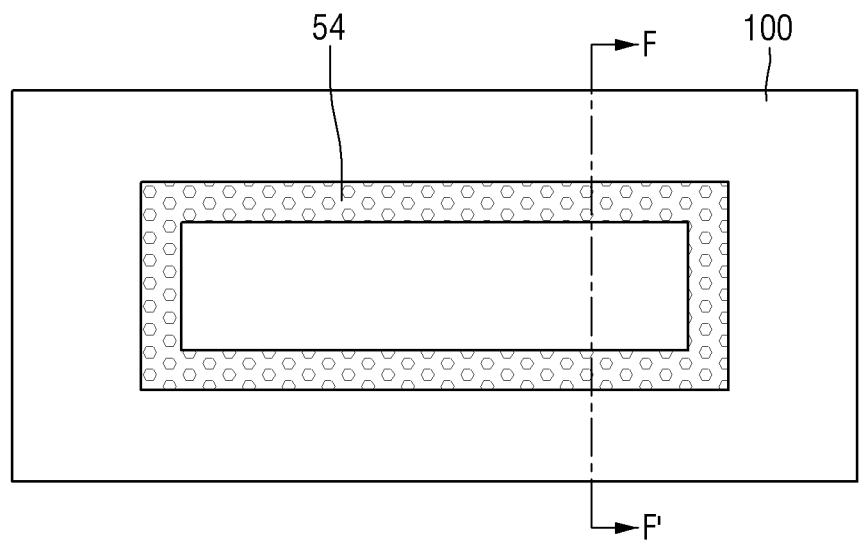
FIGS. 16A and 17A are plan views illustrating the methods according to the flow chart of FIG. 15, and FIGS. 16B and 17B are cross-sectional views taken along the line F-F' in FIGS. 16A and 17A, respectively.
Figure 16B:
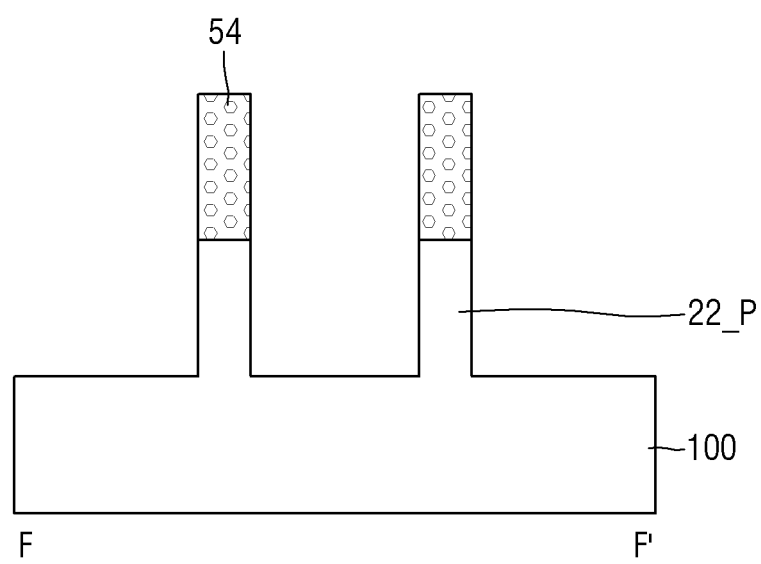
Figure 17A:
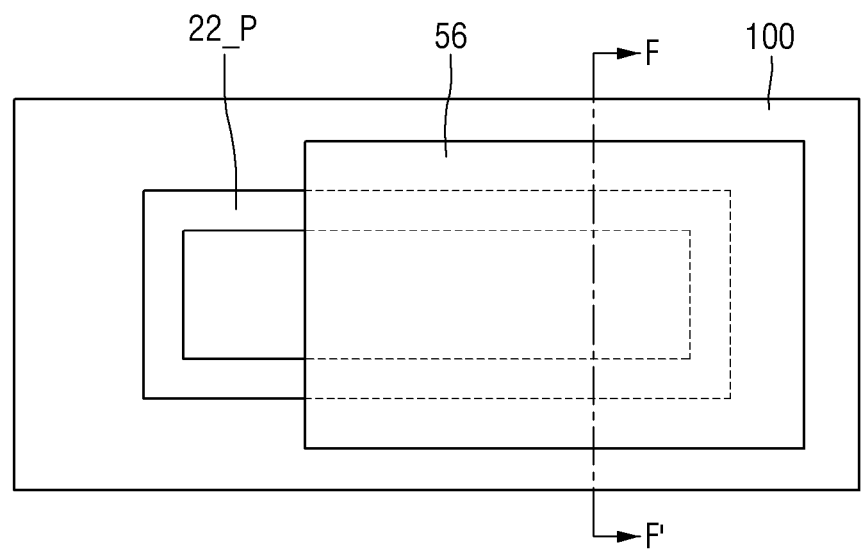

FIG. 15 is a flow chart of methods of forming a channel region of a FinFET device according to some embodiments of the inventive concept. FIGS. 16A and 17A are plan views illustrating the methods according to the flow chart of FIG. 15, and FIGS. 16B and 17B are cross-sectional views taken along the line F-F' in FIGS. 16A and 17A, respectively.

Referring to FIG. 15, the methods of forming a channel region may include forming a supporting layer 52 and a first mask layer 54 (Block S110) as shown in FIGS. 9A and 9B. Referring to FIGS. 15, 16A, and 16B, the methods of forming a channel region may include removing the supporting layer 52 (Block S125) and forming a preliminary channel region 22_P (Block S135). In some embodiments, a dry etch process and/or a wet etch process may be performed to form the preliminary channel region 22_P on the substrate 100 by etching the substrate 100 using the first mask layer 54 as an etch mask.

Figure 17B:
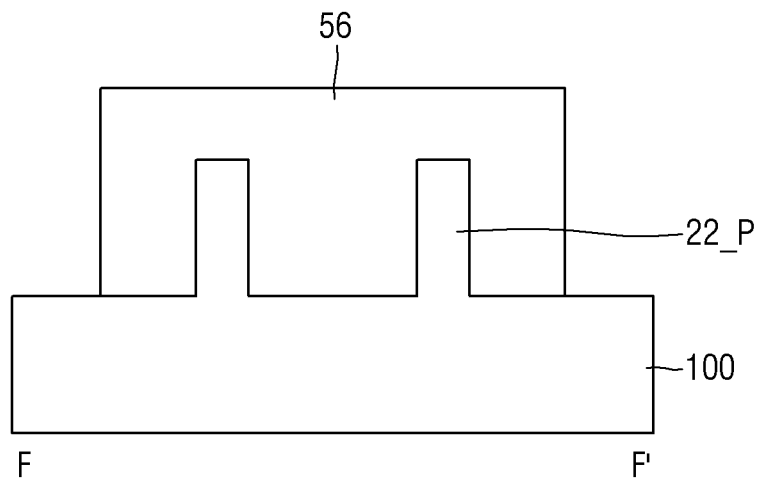

Referring to FIGS. 15, 17A, and 17B, the methods of forming a channel region may include forming a second mask layer 56 on the preliminary channel region 22_P (Block S145) and removing a portion of the preliminary channel region 22_P (Block S155). The second mask layer 56 may be formed to expose a portion of the preliminary channel region 22_P as illustrated in FIG. 17A. In some embodiments, a dry etch process and/or a wet etch process may be performed to remove the portion of the preliminary channel region 22_P by etching the preliminary channel region 22_P using the second mask layer 56 as an etch mask such that the channel region (e.g., 22 in FIGS. 14A and 14B) is formed. After forming the channel region 22, the second mask layer 56 may be removed, and an upper surface of the channel region 22 may be exposed as illustrated in FIGS. 14A and 14B.

It will be understood that the channel region 22 shown in FIG. 6C can be formed by modifying a shape of the second mask layer 56. It will be also understood that the channel region 22 shown in FIG. 6D can be formed by omitting the processes of Block S145 and Block S155.

Referring back to FIG. 7, the methods of forming a FinFET device may include, after forming the channel region 22, forming a lower insulating layer (e.g., 12 in FIG. 2A) on the substrate 100 (Block S200), forming a gate structure (e.g., 24 in FIG. 2A) on opposing vertical sides of the channel region 22 (Block S300), forming an upper insulating layer (e.g., 32 in FIG. 2A) on the gate structure (Block S400), and forming a top source/drain region (e.g., 42 in FIG. 2A) on the channel region 22 (Block S500).

Figure 19:
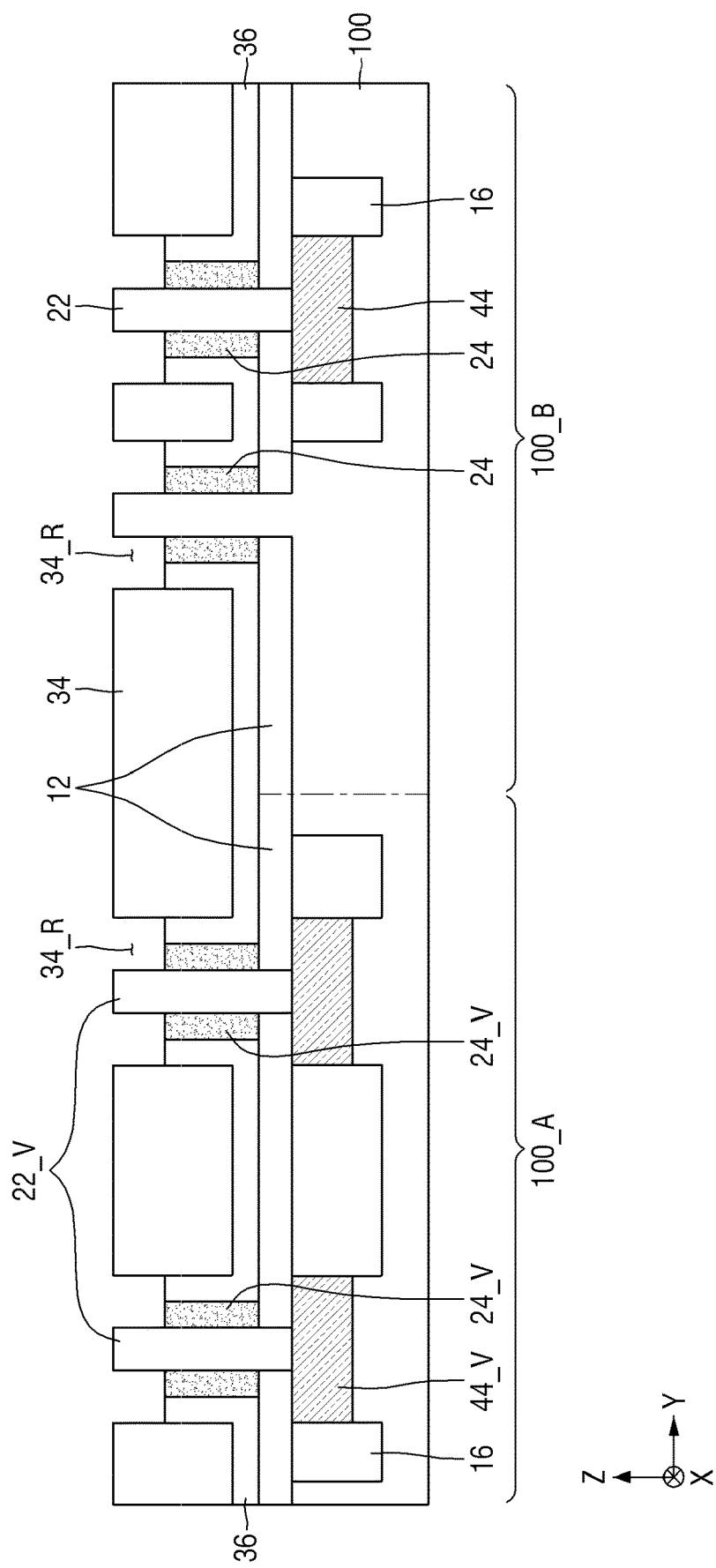
Figure 20:
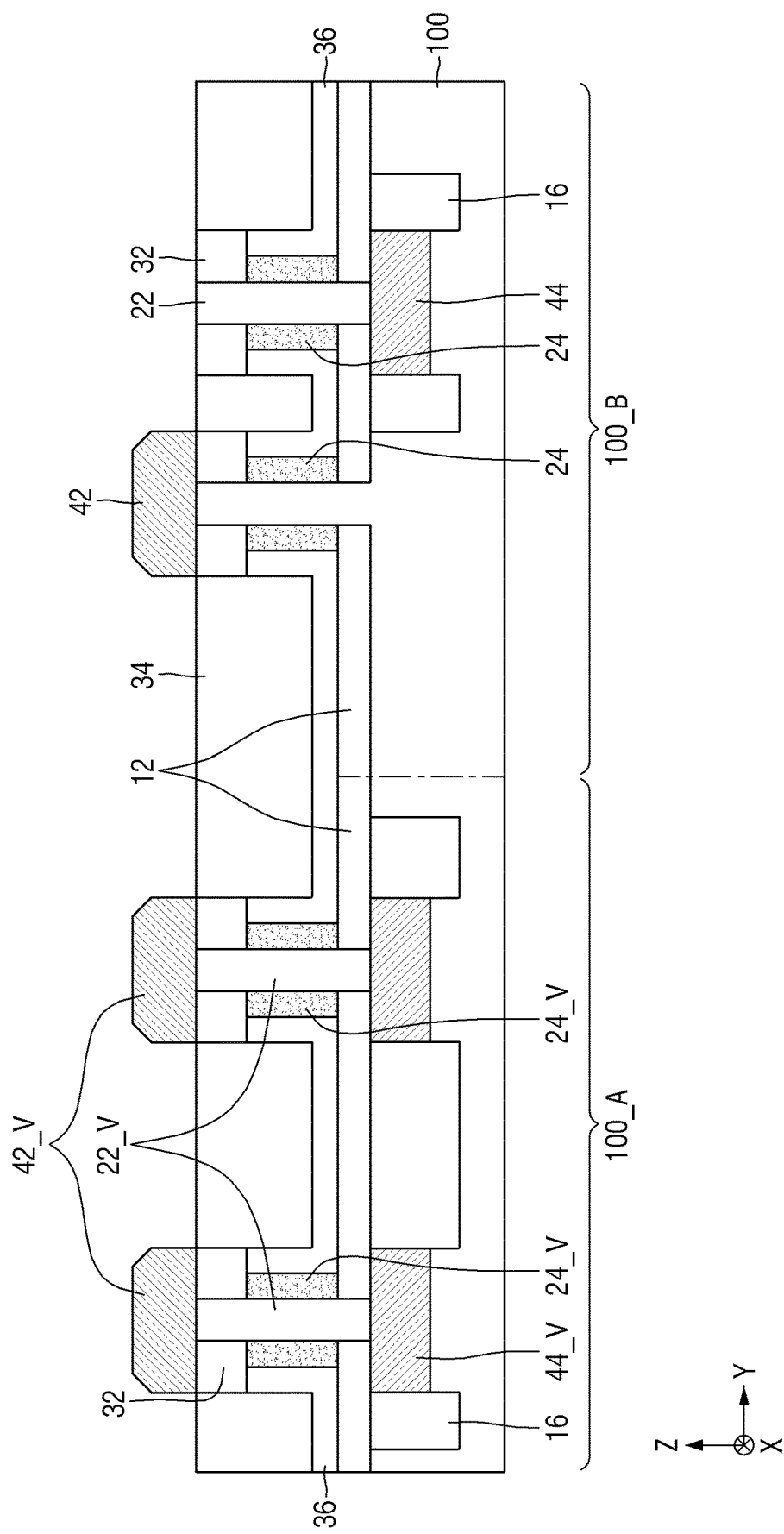

FIGS. 18, 19, and 20 are cross-sectional views illustrating methods of forming an integrated circuit device including a VFET and a FinFET according to some embodiments of the inventive concept. Referring to FIG. 18, the integrated circuit device may be formed on a substrate 100 including a first region 100_A and a second region 100_B. Although FIG. 18 shows that no intervening region is between the first region 100_A and the second region 100_B, it will be understood that an intervening region may exist between the first region 100_A and the second region 100_B.

The methods may include forming trench insulating layers 16, a bottom source/drain region 44_v of the VFET, and a bottom source/drain region 44 of the FinFET in the substrate 100. In some embodiments, the bottom source/drain region 44 of the FinFET may not be formed. In some embodiments, the trench insulating layers 16 in the first region 100_A and the second region 100_B may be formed concurrently and may have an equal thickness in the vertical direction Z. It will be understood that "formed concurrently" refers to being formed in a same fabrication step, at approximately (but not necessarily exactly) the same time, or in parallel steps that at least partially overlap in time.

In some embodiments, the bottom source/drain regions 44_v of the VFET and the bottom source/drain region 44 of the FinFET may be formed concurrently and may have an equal thickness in the vertical direction Z. In some embodiments, the bottom source/drain regions 44_v of the VFET and the bottom source/drain region 44 of the FinFET may be formed by performing an epitaxial growth process using the substrate 100 as a seed layer. In some embodiments, the bottom source/drain regions 44_v of the VFET and the bottom source/drain region 44 of the FinFET may be formed by implanting dopant atoms into the substrate 100.

The methods may include forming a channel region 22 and a vertical channel region 22_V. The vertical channel region 22_V may protrude from the substrate 100 in the vertical direction Z. It will be understood that the channel region 22 and the vertical channel region 22_V can be formed after the bottom source/drain regions 44_v of the VFET and the bottom source/drain region 44 of the FinFET are formed or before the bottom source/drain regions 44_v of the VFET and the bottom source/drain region 44 of the FinFET are formed. In some embodiments, the channel region 22 and the vertical channel region 22_V may be formed concurrently and may have an equal thickness in the vertical direction Z. The methods may also include forming a lower insulating layer 12 on the substrate 100. In some embodiments, the lower insulating layer 12 may continuously extend from the first region 100_A onto the second region 100_B.

Referring to FIG. 19, a gate structure 24, a vertical gate structure 24_V, a spacer layer 36, and an interlayer insulating layer 34 may be formed. The gate structure 24 and the vertical gate structure 24_V may be formed concurrently and may have an equal thickness in the vertical direction Z. In some embodiments, the gate structure 24 and the vertical gate structure 24_V may include the same layers having the same thicknesses. The spacer layer 36 may extend on the lower insulating layer 12, gate structure 24, and the vertical gate structure 24_V. The spacer layer 36 may include insulating material(s). For example, the spacer layer 36 may include silicon oxide, silicon nitride, and/or silicon oxynitride. The interlayer insulating layer 34 may include insulating material(s), for example, silicon oxide and/or low k material that has a dielectric constant lower than silicon dioxide. In some embodiments, the interlayer insulating layer 34 may include recesses 34_R exposing upper portions of the channel region 22 and the vertical channel region 22_V, as illustrated in FIG. 19.

Referring to FIG. 20, an upper insulating layer 32, a top source/drain region 42 of the FinFET, and a top source/drain region 42_V of the VFET may be formed. In some embodiments, the upper insulating layer 32 may be formed in the recesses 34_R of the interlayer insulating layer 34. For example, a preliminary upper insulating layer (not shown)

may be formed in the recesses 34_R of the interlayer insulating layer 34 and on the interlayer insulating layer 34, and then the preliminary upper insulating layer may be partially removed to leave the upper insulating layer 32 in the recesses 34_R. The top source/drain regions 42_V of the VFET may vertically overlap the vertical channel regions 22_V, respectively.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that references herein to "an element A vertically overlapping an element B" (or similar language) means that a vertical line intersecting both the elements A and B exists. It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
    a channel region protruding from a substrate in a vertical direction that is perpendicular to an upper surface of the substrate;
    a first source/drain region and a second source/drain region on the substrate, wherein the first and second source/drain regions contact a first portion and a second portion of the channel region, respectively, and a third portion of the channel region between the first and second portions comprises a first channel region extending longitudinally in a first horizontal direction that is perpendicular to the vertical direction and a second channel region extending longitudinally in a second horizontal direction that is perpendicular to the vertical direction and traverses the first horizontal direction; and
    a gate structure on opposing vertical sides of the channel region, wherein the gate structure comprises a portion that is between the substrate and the first source/drain region, and the first source/drain region vertically overlaps the portion of the gate structure.

2. The integrated circuit device of claim 1, wherein the gate structure extends from the first portion of the channel region onto the second portion of the channel region.

3. The integrated circuit device of claim 1, wherein an upper portion of the channel region protrudes in the vertical direction beyond an upper surface of the gate structure.

4. The integrated circuit device of claim 3, further comprising an insulating layer extending between the first source/drain region and the gate structure and separating the first source/drain region from the gate structure.

5. The integrated circuit device of claim 3, wherein an upper surface of the channel region is exposed by the gate structure.

6. The integrated circuit device of claim 1, wherein the third portion of the channel region between the first and second portions further comprises a third channel region extending longitudinally in the first horizontal direction, and the second channel region is between the first channel region and the third channel region.

7. The integrated circuit device of claim 6, wherein the first channel region has a first length in the first horizontal direction, the third channel region has a second length in the first horizontal direction, and the first length is shorter than the second length.

8. The integrated circuit device of claim 1, wherein the gate structure encloses the channel region in plan view.

9. An integrated circuit device comprising:
a Fin field-effect transistor (FinFET) comprising:
a channel region protruding from a substrate in a vertical direction that is perpendicular to an upper surface of the substrate;
a first source/drain region and a second source/drain region on the substrate; and
a gate structure on opposing vertical sides of the channel region, wherein the gate structure is curved in plan view, and wherein the gate structure comprises a lower surface facing the substrate and an upper surface that is opposite the lower surface and faces the first source/drain region.

10. The integrated circuit device of claim 9, wherein an upper portion of the channel region protrudes in the vertical direction beyond the upper surface of the gate structure.

11. The integrated circuit device of claim 9, further comprising an insulating layer,
wherein the first source/drain region and the gate structure are spaced apart from each other in the vertical direction by a gap between the first source/drain region and the gate structure, and
wherein the insulating layer is in the gap.

12. The integrated circuit device of claim 9, wherein the gate structure encloses the channel region in plan view.

13. The integrated circuit device of claim 9, wherein the gate structure is curved twice in plan view.

14. The integrated circuit device of claim 9, further comprising a vertical field-effect transistor (VFET) device, wherein the VFET comprises:
a vertical channel region protruding from the substrate in the vertical direction;
a bottom source/drain region in the substrate and a top source/drain region on the vertical channel region, wherein the vertical channel region is between the substrate and the top source/drain region; and
a vertical gate structure on a side of the vertical channel region, wherein the vertical gate structure of VFET and the gate structure of FinFET have an equal thickness in the vertical direction.

15. An integrated circuit device comprising:
a channel region protruding from a substrate in a vertical direction that is perpendicular to an upper surface of the substrate, wherein the channel region comprises first and second channel regions that are spaced apart from each other in a first horizontal direction and extend longitudinally in a second horizontal direction that is perpendicular to the vertical direction and traverses the first horizontal direction;
a first source/drain region and a second source/drain region, wherein the first source/drain region vertically overlaps the channel region;
a gate structure extending on opposing vertical sides of the channel region, wherein the first source/drain region and the gate structure are spaced apart from each other in the vertical direction by a gap between the first source/drain region and the gate structure; and
an insulating layer in the gap.

16. The integrated circuit device of claim 15, wherein the gate structure is curved in plan view.

17. The integrated circuit device of claim 15, wherein the second source/drain region is in the substrate.

18. The integrated circuit device of claim 17, wherein the insulating layer comprises a first insulating layer, and
wherein the integrated circuit device further comprises a second insulating layer extending between the gate structure and the second source/drain region and separating the gate structure from the second source/drain region.

19. The integrated circuit device of claim 15, wherein the second source/drain region vertically overlaps the channel region.

20. The integrated circuit device of claim 15, wherein the first channel region has a first length in the second horizontal direction, the second channel region has a second length in the second horizontal direction, and the first length is shorter than the second length.

* * * * *